(12) United States Patent
Iwasaka et al.

(10) Patent No.: US 10,643,881 B2
(45) Date of Patent: May 5, 2020

(54) BAFFLE PLATE

(71) Applicant: HARMOTEC CO., LTD., Kofu, Yamanashi (JP)

(72) Inventors: Hitoshi Iwasaka, Kofu (JP); Hideyuki Tokunaga, Kofu (JP); Yuji Kasai, Kofu (JP); Katsuhiro Koshiishi, Kofu (JP); Hidemitsu Tanaka, Kofu (JP)

(73) Assignee: HARMOTEC CO., LTD., Kofu (JP)

( * ) Notice: Subject to any disclaimer, the term of this patent is extended or adjusted under 35 U.S.C. 154(b) by 75 days.

(21) Appl. No.: 16/070,995

(22) PCT Filed: Oct. 27, 2017

(86) PCT No.: PCT/JP2017/038997
§ 371 (c)(1),
(2) Date: Jul. 18, 2018

(87) PCT Pub. No.: WO2018/110121
PCT Pub. Date: Jun. 21, 2018

(65) Prior Publication Data
US 2019/0027393 A1    Jan. 24, 2019

(30) Foreign Application Priority Data

Dec. 16, 2016  (JP) .................................. 2016-244447

(51) Int. Cl.
*B25J 15/06* (2006.01)
*H01L 21/677* (2006.01)
(Continued)

(52) U.S. Cl.
CPC ...... *H01L 21/6838* (2013.01); *B25J 15/0683* (2013.01); *B65G 49/061* (2013.01);
(Continued)

(58) Field of Classification Search
CPC ............... B25J 15/0616; B25J 15/0683; B25J 11/0045; H01L 21/6838; B65G 47/911;
(Continued)

(56) References Cited

U.S. PATENT DOCUMENTS 3,438,668 A * 4/1969 Williams .............. B66C 1/0268
294/64.3
7,452,016 B2 * 11/2008 Tanae ................... B65G 47/911
294/64.3
(Continued)

FOREIGN PATENT DOCUMENTS

EP            2562105 A1 *  2/2013   ........... B65G 47/911
JP       2016-159405 A      9/2016
TW          M476189 U       4/2014

OTHER PUBLICATIONS

Jul. 12, 2018 Office Action issued in Taiwanese Patent Application No. 106136645.
(Continued)

*Primary Examiner* — Dean J Kramer
(74) *Attorney, Agent, or Firm* — Oliff PLC

(57) ABSTRACT

Baffle plate to be attached to fluid flow-forming body includes baffle plate main body that is attachable to and detachable from fluid flow-forming body. Baffle plate main body allows a fluid to which suction is applied by negative pressure generated by fluid flow-forming body to pass through, while preventing a member from entering concave part of fluid flow-forming body. Baffle plate also includes support member that is attached to main body of fluid flow-forming body at one end thereof, and supports baffle plate main body at the other end thereof such that baffle plate main body opposes end face of fluid flow-forming body. Support member supports baffle plate main body such that a
(Continued)

gap between end face and baffle plate main body is maintained, and a fluid path is formed that allows a fluid flowing out of concave part to flow.

9 Claims, 10 Drawing Sheets

(51) Int. Cl.
*B65G 49/07* (2006.01)
*H01L 21/683* (2006.01)
*B65G 49/06* (2006.01)

(52) U.S. Cl.
CPC ........ *B65G 49/07* (2013.01); *H01L 21/67778* (2013.01); *B65G 2201/022* (2013.01); *B65G 2249/045* (2013.01)

(58) Field of Classification Search
CPC . B65G 49/061; B65G 49/07; B65G 2249/045

USPC ....................................................... 294/64.3
See application file for complete search history.

(56) References Cited

U.S. PATENT DOCUMENTS

| 8,714,609 B2 * | 5/2014 | Sydorko | ............... B25B 11/007 |
| | | | 294/64.3 |
| 8,904,629 B2 * | 12/2014 | Ryu | ..................... B65G 47/911 |
| | | | 29/740 |
| 2016/0288334 A1 * | 10/2016 | Li | ........................ B65G 47/911 |
| 2018/0065257 A1 | 3/2018 | Iwasaka et al. | |

OTHER PUBLICATIONS

Jan. 16, 2020 Office Action issued in Korean Patent Application No. 10-2018-7022489.

* cited by examiner

BAFFLE PLATE

TECHNICAL FIELD

The present invention pertains to a baffle plate to be attached to a device that applies suction to a material by use of Bernoulli's principle.

BACKGROUND ART

Known in the art are devices for applying suction to a plate-like member such as a semiconductor wafer or a glass substrate by use of Bernoulli's principle. For example, in Patent Document 1, a suction device is described, which includes a swirl flow-forming body that forms a swirl flow within a concave part of the swirl flow-forming body. The swirl flow formed within the concave part generates a negative pressure that applies suction to a member. The suction device also includes a baffle plate for preventing the member from entering the concave part, and connecting members for forming, between an end face of the swirl flow-forming body and the baffle plate, a flow path that allows a fluid flowing out of the concave part to flow. This suction device is able to apply suction to the member in a stable manner.

PRIOR ART DOCUMENT

Patent Document

Patent Document 1: JP 2016-159405 A1

SUMMARY OF THE INVENTION

Problems to be Solved by the Invention

The present invention has been made in view of the above technology, and has as its object provision of a baffle plate including a baffle plate main body that can be removably attached to a fluid flow-forming body that forms a swirl flow or a radial flow generating a negative pressure that applies suction to a member.

Means for Solving the Problems

To solve the problem described above, the present invention provides a baffle plate to be attached to a fluid flow-forming body, the fluid flow-forming body comprising: a columnar main body; a flat end face formed at the main body; a concave part formed at the end face; and a fluid flow forming means for forming a fluid swirl flow in the concave part or forming a radial flow by discharging fluid into the concave part, the fluid swirl flow or the radial flow generating negative pressure that applies suction to a member, the baffle plate comprising: a baffle plate main body that is attachable to and detachable from the fluid flow-forming body, and that allows a fluid to which suction is applied by the negative pressure to pass through, while preventing the member from entering the concave part; and a support member that is attached to the main body at one end of the support member, and supports the baffle plate main body at another end of the support member such that the baffle plate main body opposes the end face, and that supports the baffle plate main body such that a gap between the end face and the baffle plate main body is maintained, and a fluid path is formed that allows a fluid flowing out of the concave part to flow.

In a preferred mode of the invention the baffle plate may further comprise a gap maintaining part that maintains the gap between the end face and the baffle plate main body.

In a further preferred mode of the invention the support member may comprise a claw part that is hooked on a surface of the main body, the surface being opposite the end face, the gap maintaining part and the claw part may hold the main body therebetween, and the gap maintaining part may form the fluid path.

In a further preferred mode of the invention the baffle plate main body may comprise: an opening that is formed at a central part of the baffle plate main body, a position of the member a part of which has entered the opening being determined; and a hole that is formed around the opening such that the baffle plate attached to the fluid flow-forming body opposes the concave part.

In a further preferred mode of the invention the support member may be attached to the main body by use of an elastomeric force of the support member.

Effects of the Invention

The present invention provides a baffle plate including a baffle plate main body that can be removably attached to a fluid flow-forming body that forms a swirl flow or a radial flow generating a negative pressure that applies suction to a member.

Figure 1:
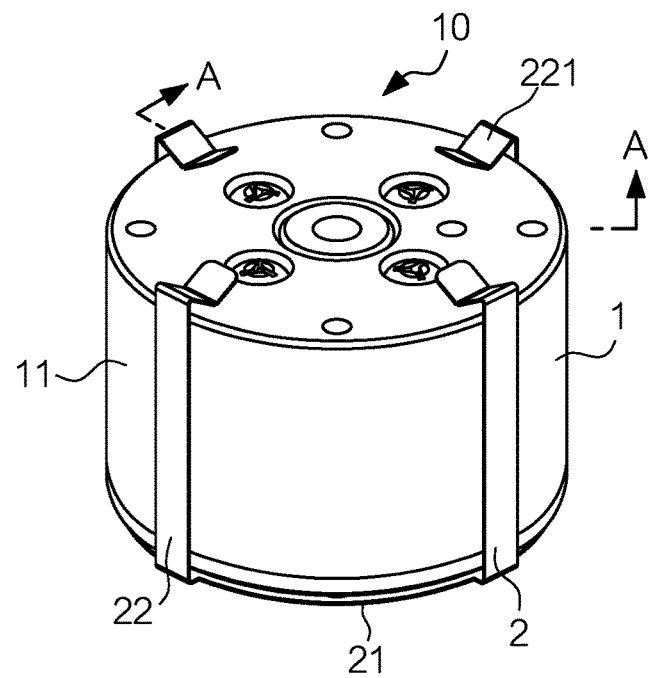
FIG. 1 is a perspective view of an example of suction device 10.

DESCRIPTION OF REFERENCE NUMERALS 1, 1A, 3 . . . swirl flow-forming body, 2, 2A, 2B, 2C, 2D, 2E . . . baffle plate, 10, 10A, 10B, 10C, 10D . . . suction device, 11 . . . main body, 12 . . . end face, 13 . . . concave part, 14 . . . jetting port, 15 . . . inclined surface, 16 . . . supply port, 17 . . . annular passage, 18 . . . communication passage, 19 . . . supply path, 21, 21A . . . baffle plate main body, 22, 22A, 22B, 22C . . . support member, 31 . . . main body, 32 . . . through hole, 33 . . . first end face, 34 . . . second end face, 35 . . . jetting port, 36 . . . supply port, 37 . . . fluid passage, 38 . . . cover, 39, 2111 . . . spacer, 111 . . . inner-peripheral side surface, 112 . . . groove part, 211, 211A, 211B . . . outer annular plate, 212 . . . inner annular plate, 221, 221A, 221B, 221C, . . . claw part, 222 . . . r part, 223 . . . step part, 311 . . . inner periphery, 312 . . . outer periphery, 2112 . . . guide part, 2121 . . . opening, 2122 . . . hole

MODES FOR IMPLEMENTING THE INVENTION

Modes for carrying out the present invention are explained below with reference to the drawings.

1. First Embodiment

Figure 2:
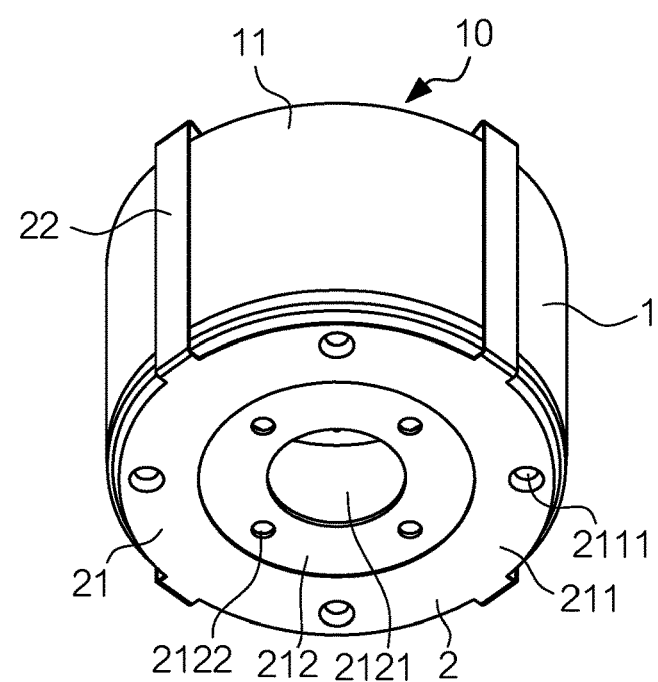
FIG. 2 is another perspective view of suction device 10 as seen from a different angle.
Figure 3:
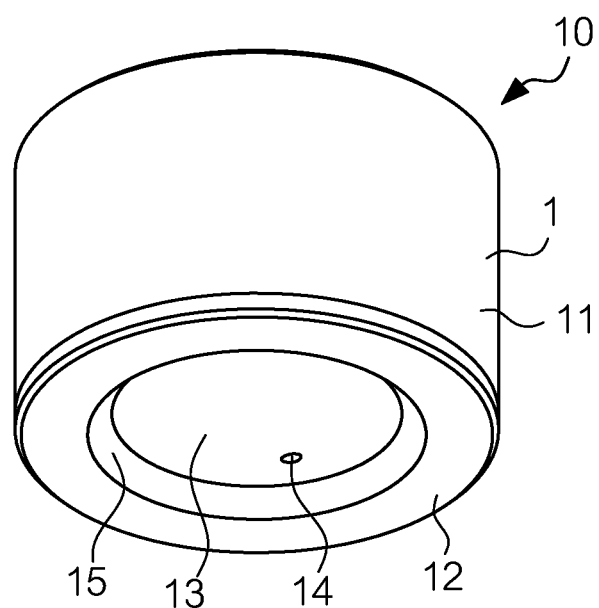
FIG. 3 is an exploded perspective view of suction device 10.
Figure 3:
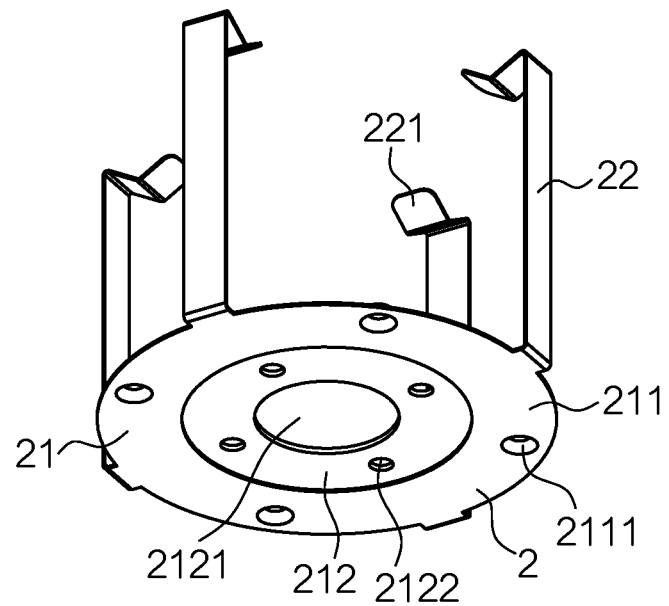
Figure 4:
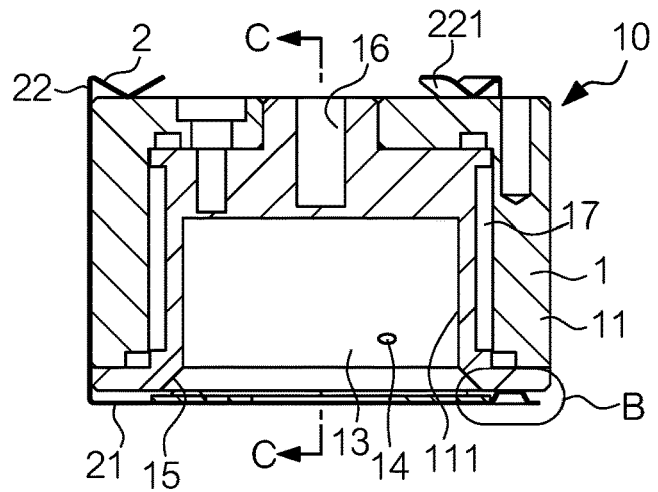
FIG. 4 is a cross-sectional view of suction device 10 along line A-A shown in FIG. 1.
Figure 5:
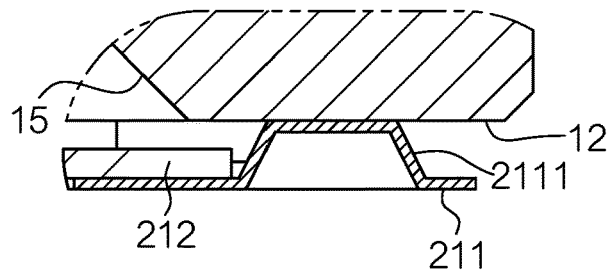
FIG. 5 is an enlarged view of part B shown in FIG. 4.
Figure 6:
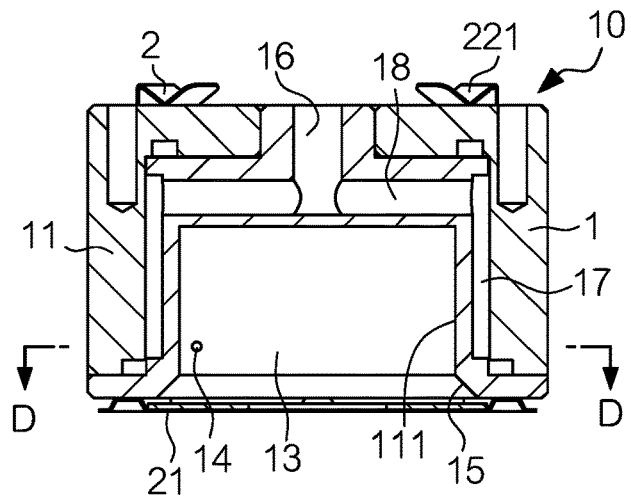
FIG. 6 is a cross-sectional view of suction device 10 along line C-C shown in FIG. 4.
Figure 7:
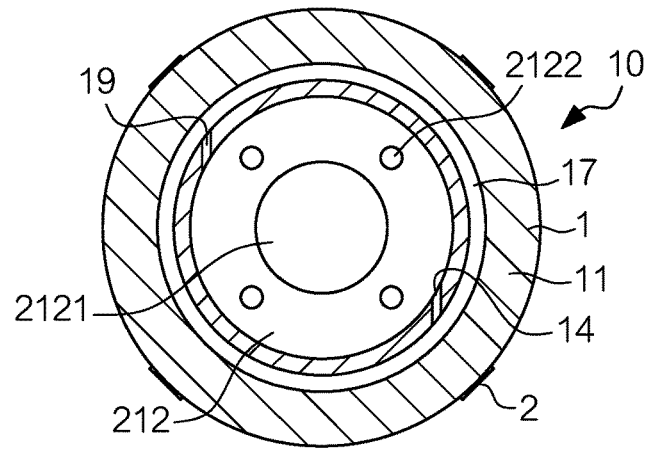
FIG. 7 is a cross-sectional view of suction device 10 along line D-D shown in FIG. 6.

FIG. 1 is a perspective view of suction device 10 according to a first embodiment. FIG. 2 is another perspective view of suction device 10 as seen from a different angle. FIG. 3 is an exploded perspective view of suction device 10. FIG. 4 is a cross-sectional view of suction device 10 along line A-A shown in FIG. 1. FIG. 5 is an enlarged view of part B shown in FIG. 4. FIG. 6 is a cross-sectional view of suction device 10 along line C-C shown in FIG. 4. FIG. 7 is a cross-sectional view of suction device 10 along e D-D shown in FIG. 6. Suction device 10 is a device for applying suction to a food such as a strawberry so that the food can be held and conveyed. Suction device 10 is attached to an end of a robot arm, for example.

Suction device 10 includes swirl flow-forming body 1 and baffle plate 2 that can be removably attached to swirl flow-forming body 1. Swirl flow-forming body 1 is a device for forming a swirl flow that applies suction to a member by use of Bernoulli's principle. Swirl flow-forming body 1 is an example of a "fluid flow-forming body" according to the present invention. Baffle plate 2 is a member for preventing a member to which suction is applied by swirl flow-forming body 1 from entering concave part 13 (described later). To be attached to swirl flow-forming body 1, baffle plate 2 includes support members 22 (described later) that can be pushed apart to accommodate and hold swirl flow-forming body 1.

Swirl flow-forming body 1 includes main body 11, end face 12, concave part 13, two jetting ports 14, and inclined surface 15. Main body 11 is made from an aluminum alloy and has a columnar shape. End face 12 is formed in a flat shape on one of the surfaces (specifically, the surface that deals with a member to be conveyed) (hereafter referred to as "bottom surface") of main body 11. Concave part 13 is a column-shaped bottomed hole and is formed on end face 13. Concave part 13 is formed on the same axis as main body 11. Two jetting ports 14 are formed on inner-peripheral side surface 111 of main body 11 that faces concave part 13. Two jetting ports 14 are arranged nearer end face 12 in relation to the center in the axial direction of inner-peripheral side surface 111, and are arranged such that they are in mutual opposition to each other. Specifically, jetting ports 14 are arranged in point symmetry about the axial center of the central axis of main body 11 or concave part 13. Jetting ports 14 allow fluid supplied to swirl flow-forming body 1 to be discharged into concave part 13. The fluid herein refers to a gas such as compressed air, or a liquid such as pure water or carbonated water. Inclined surface 15 is formed on the opening end of main body 11.

Swirl flow-forming body 1 also includes supply port 16, annular passage 17, communication passage 18, and two supply paths 19. Supply port 16 has a disk shape and is provided in the center of the top surface (that is, the surface opposite the bottom surface) of main body 11. Supply port 16 is connected to a fluid supply pump, which is not illustrated, via a tube, for example. Main body 11 is supplied with a fluid therewithin via supply port 16. Annular passage 17 has a cylindrical shape and is formed inside main body 11 so as to surround concave part 13. Annular passage 17 is formed on the same axis as concave part 13. Annular passage 17 supplies supply path 19 with fluid supplied from communication passage 18. Communication passage 18 is provided inside main body 11 and extends in the radial direction of the bottom surface or top surface of main body 11 in a straight line. Communication passage 18 communicates, at both ends thereof, with annular passage 17. Communication passage 18 supplies annular passage 17 with fluid supplied into main body 11 via supply port 16. Two supply paths 19 are formed such that they are approximately parallel to end face 12, extend in a direction tangential to the outer periphery of concave part 13, and extend parallel to each other. Each of supply paths 19 communicates with annular passage 17 at one end thereof, and communicates with jetting port 14 at the other end thereof. Each of supply paths 19 forms a fluid swirl flow within concave part 13. Each of supply paths 19 is one example of a "fluid flow-forming means" according to the present invention.

Baffle plate 2 includes baffle plate main body 21 and four support members 22. Baffle plate main body 21 is a member that can be removably attached to swirl flow-forming body 1, and that allows a fluid to which suction is applied by swirl flow forming body 1 to pass through, while preventing a member to which the suction is applied from entering concave part 13. Baffle plate main body 21 has an annular shape. Each of support members 22 is fixed on main body 11 at one end thereof such that the one end can be detached from main body 11, and supports baffle plate main body 21 at the other end thereof such that baffle plate main body 21 opposes end face 12. Support members 22 support baffle plate main body 21 such that a gap is maintained between end face 12 and baffle plate main body 21, and that a fluid path is formed that allows a fluid flowing out of concave part 13 to flow. Also, support members 22 support baffle plate main body 21 such that baffle plate n body 21 covers a part of concave part 13. Baffle plate main body 21 and support members 22 are integrally formed.

Baffle plate main body 21 includes outer annular plate 211 and inner annular plate 212. Outer annular plate 211 is made from a plate spring material and has an annular shape. The outer diameter of outer annular plate 211 is substantially identical to the outer diameter of end face 12 in length, and the inner diameter of outer annular plate 211 is substantially identical to the inner diameter of end face 12 (in other words, the diameter of the opening of concave part 13) in length. Outer annular plate 211 includes four spacers 2111. Spacers 2111 are provided such that they maintain a gap between end face 12 and baffle plate main body 21. Spacers 2111 and claw parts 221 (described later) of support members 22 hold main body 11 therebetween. Spacers 2111 form a flow path that allows a fluid flowing out of concave part 13 to flow Each of spacers 2111 is one example of a "gap maintaining part" according to the present invention. Spacers 2111 are formed at the outer edge of outer annular plate 211 at regular intervals. Spacers 2111 are formed by embossing such that they have a circular shape and they all have a substantially identical height. The height of spacers 2111 defines a gap between end face 12 and baffle plate main body 21, which height is determined based on the flow amount of fluid supplied from the fluid supply pump to suction device 10. For example, the height is determined such that a fluid flowing out of concave part 13 passes through the flow path formed by spacers 2111 between end face 12 and baffle plate main body 21, without passing through opening 2121 (described later) of inner annular plate 212. The height is preferably as small as possible to maintain the suction power of suction device 10.

Inner annular plate 212 is made from an elastic member such as a rubber material or a highly elastic resin, and has an annular shape. Inner annular plate 212 can deform according to a shape of a member with which the plate has come into contact. The outer diameter of inner annular plate 212 is larger than the diameter of the opening of outer annular plate 211, and is smaller than the outer diameter of outer annular plate 211. Inner annular plate 212 is attached to outer annular plate 211 by use of adhesive or screws on the same axis as outer annular plate 211. Inner annular plate 212 includes opening 2121 and four holes 2122. Opening 2121, which has a circular shape, is formed at the center of inner annular plate 212 (in other words, at the center of baffle plate main body 21). Opening 2121 determines a position of a member, a part of which has entered the opening. The diameter of opening 2121 is smaller than the diameter of the opening of concave part 13. Holes 2122, which have a circular shape, are formed around opening 2121 at regular intervals such that baffle plate 2 attached to swirl flow-forming body 1 opposes concave part 13. The diameter of holes 2122 is smaller than the diameter of opening 2121.

Support members 22 are formed by folding elongated plate spring materials that extend from the edge of baffle plate main body 21 at regular intervals, in a direction substantially perpendicular to baffle plate main body 21. The plate spring materials are longer than the length in the axial direction of main body 11. The plate spring materials are folded at an angle such that main body 11 of swirl flow-forming body 1 to which baffle plate 2 is attached is pressed at the side surface thereof due to restoring forces (or elastomeric forces) of support members 22, so that main body 11 is held between support members 22. Each of support members 22 includes claw part 221 at an end thereof, which is to be hooked and fixed on the outer edge of the top surface of main body 11. Claw part 221 is formed by folding inward one end of a plate spring material in a direction substantially perpendicular to the direction in which the plate spring material extends. The plate spring material is folded at an angle such that main body 11 of swirl flow-forming body 1 to which baffle plate 2 is attached is pressed at the top and bottom surfaces thereof due to a restoring force (or an elastomeric force) of claw part 221, so that main body 11 is held between claw part 221 and spacer 2111. Claw part 221 is bent into a V-shape such that, when swirl flow-forming body 1 is provided with baffle plate 2, claw part 221 projects toward the top surface of main body 11.

Now, a suction operation of suction device 10 is described below. When swirl flow-forming body 1 is supplied with fluid from the fluid supply pump via supply port 16, the fluid passes through communication passage 18, annular passage 17, and supply paths 19 to be discharged from jetting ports 14 into concave part 13. The fluid discharged into concave part 13 creates a swirl flow within concave part 13, and subsequently flows out of the opening of concave part 13. At this time, if a strawberry is present in a position that opposes baffle plate main body 21, inflow of external fluid to concave part 13 is limited, and the density of fluid molecules per unit volume in the center of the swirl flow becomes reduced due to centrifugal force and entrainment effect of the swirl flow; in other words, negative pressure is generated within concave part 13. As a result, fluid something suction device 10 starts to flow into concave part 13 via opening 2121 and holes 2122 of baffle plate 2, so that pressure is applied to the strawberry by the surrounding fluid to be gravitated towards suction device 10. When the tip of the strawberry enters opening 2121 of baffle plate 2, a position of the strawberry is determined. On the other hand, the fluid flowing out of concave part 13 passes through the flow path formed between baffle plate main body 21 and end face to be discharged out of suction device 10, without passing through opening 2121 and holes 2122 of baffle plate 2.

As described in the foregoing, suction device 10 includes baffle plate 2 for preventing a member from entering concave part 13, so that the member is prevented from coming into contact with inclined surface 15 of swirl flow-forming body 1 and becoming scratched. Also, most of the fluid flowing out of concave part 13 is discharged out of suction device 10, without passing through opening 2121 and holes 2122 of baffle plate 2, so that the fluid is prevented from colliding with the member. As a result, undulation and rotation of the material is controlled; in other words, suction can be applied to the member in a stable manner. Also, baffle plate 2 is attached to swirl flow-forming body 1 such that baffle plate 2 can be detached from swirl flow-forming body 1 without using a tool, so that it is easy to remove unwanted matter that has become stuck between swirl flow-forming body 1 and baffle plate 2, or to clean baffle plate 2 separately from swirl flow-forming body 1. Also, baffle plate 2 is attached to swirl flow-forming body 1 by use of elastomeric forces of support member 22, so that baffle plate 2 is unlikely to drop from swirl flow-forming body 1, as compared with a case where support members 22 are not made from plate spring materials. Also, in a case where a part of the member has entered and blocked opening 2121, holes 2122 allow surrounding fluid to flow into concave part 13, so that surrounding fluid is prevented from forcibly flowing through a gap between opening 2121 and the member. As a result, a vibration noise of inner annular plate 212 is controlled. Also, suction device 10 discharges all sucked fluid out of suction device 10, and none of the sucked fluid enters concave part 13 or jetting port 14, whereby contamination of a fluid supply path is controlled.

2. Second Embodiment

Figure 8:
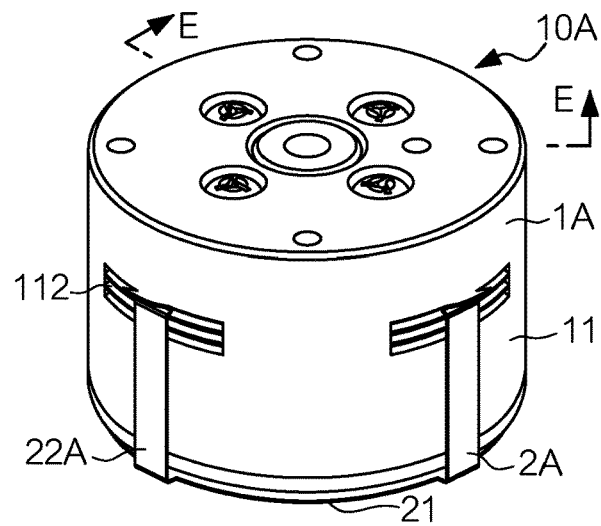
FIG. 8 is a perspective view of an example of suction device 10A.
Figure 9:
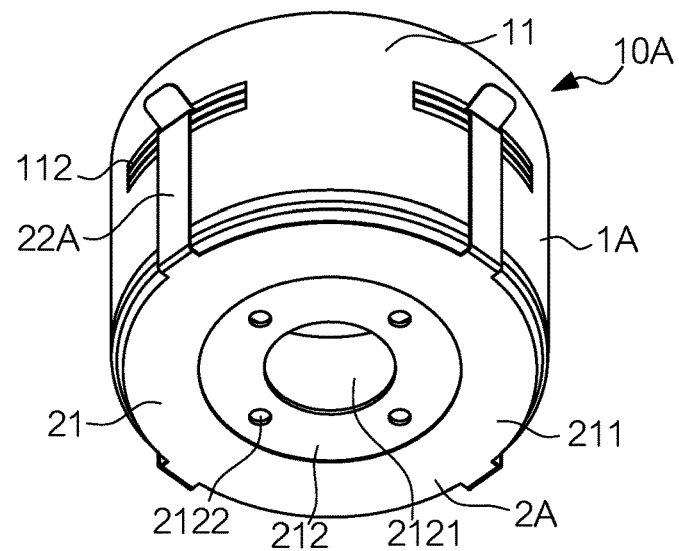
FIG. 9 is another perspective view of suction device 10A as seen from a different angle.
Figure 10:
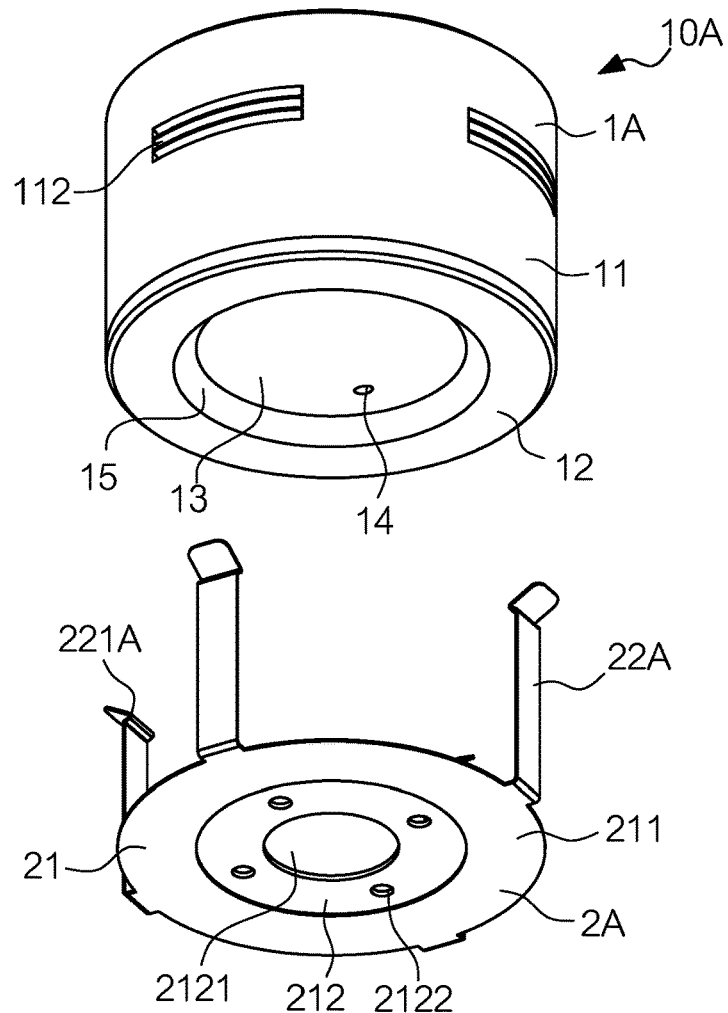
FIG. 10 is an exploded perspective view of suction device 10A.
Figure 11:
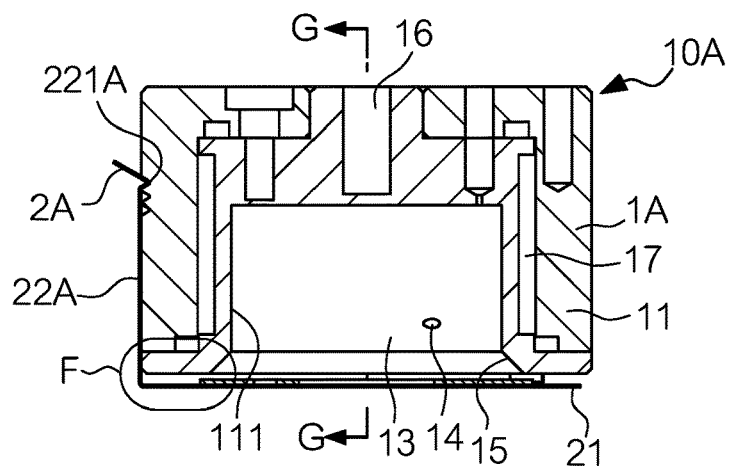
FIG. 11 is a cross-sectional view of suction device 10A along line E-E shown in FIG. 8.
Figure 12:
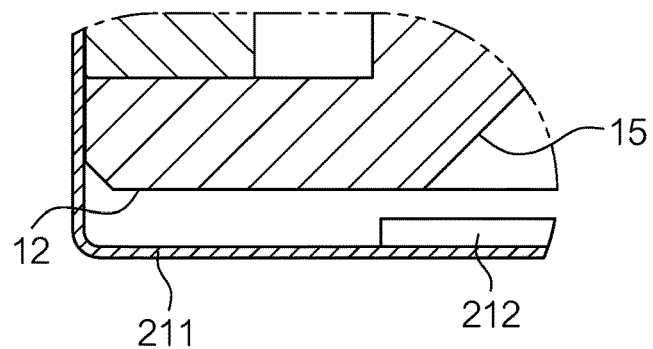
FIG. 12 is an enlarged view of part F shown in FIG. 11.
Figure 13:
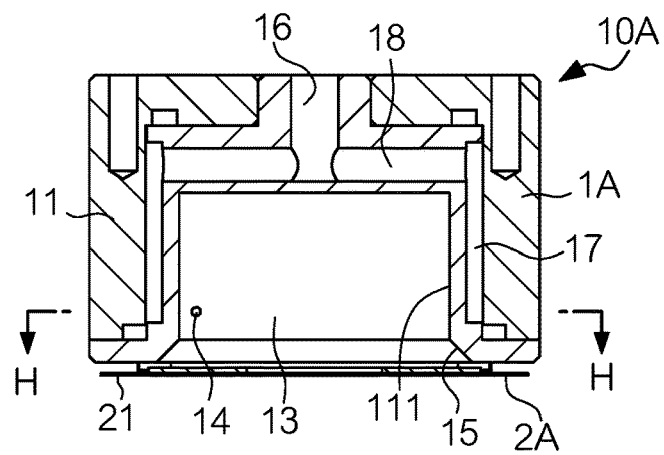
FIG. 13 is a cross-sectional view of suction device 10A along line G-G shown in FIG. 11.
Figure 14:
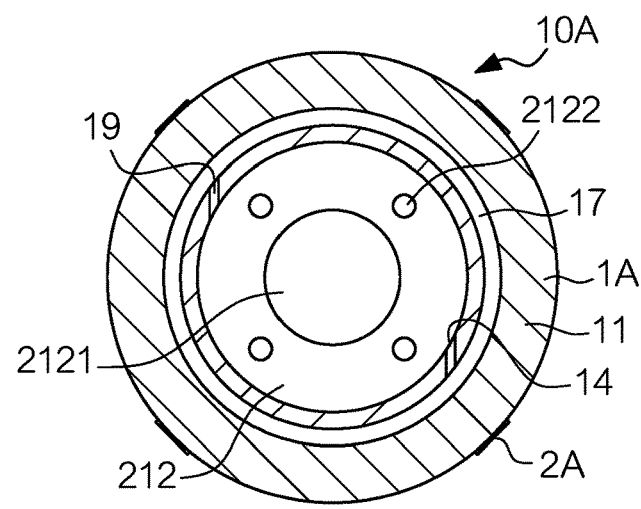
FIG. 14 is a cross-sectional view of suction device 10A along line H-H shown in FIG. 13.

FIG. 8 is a perspective view of suction device 10A according to a second embodiment. FIG. 9 is another perspective view of suction device 10A as seen from a different angle. FIG. 10 is an exploded perspective view of suction device 10A. FIG. 11 is a cross-sectional view of suction device 10A along line E-E shown in FIG. 8. FIG. 12 is an enlarged view of part F shown in FIG. 11. FIG. 13 is a cross-sectional view of suction device 10A along line G-G shown in FIG. 11. FIG. 14 is a cross-sectional view of suction device 10A along line H-H shown in FIG. 13. Suction device 10A differs from suction device 10 according to the first embodiment in that support members of a baffle plate are fixed on the side surface of a main body of a swirl flow-forming body, and in that suction device 10A lacks spacers. Only these differences are described in detail below.

Suction device 10A includes swirl flow-forming body 1A and baffle plate 2A that can be removably attached to swirl flow-forming body 1A. Swirl flow-forming body 1A is a device for forming a swirl flow that applies suction to a member by use of Bernoulli's principle. Swirl flow-forming body 1A is an example of a "fluid flow-forming body" according to the present invention. Baffle plate 2A is a member for preventing a member to which suction is applied by swirl flow-forming body 1A from entering concave part 13. To be attached to swirl flow-forming body 1A, baffle plate 2A includes support members 22A (described later) that can be pushed apart to accommodate and hold swirl flow-forming body 1A.

Swirl flow-forming body 1 includes four groove parts 112 in addition to main body 11, end face 12, concave part 13, two jetting ports 14, and inclined surface 15. The components other than groove parts 112 are shared with the first embodiment; accordingly, a description of the shared components is omitted. Groove parts 112 are formed on the side surface of main body 11 at regular intervals. Groove parts 112 are arranged nearer the top surface in relation to the center in the axial direction of side surface of main body 11. Groove parts 112 are shorter in the circumferential direction than a quarter of a circle of the outer periphery of end face 12. Each of groove parts 112 includes three V-shaped grooves (in other words, slits) that extend in the circumferential direction and are arranged in the axial direction. Claw part 221A (described later) of baffle plate 2A is engaged with each of groove parts 112.

Swirl flow-forming body 1A also includes supply port 1A annular passage 17, communication passage 18, and two supply paths 19. The components are shared with the first embodiment; accordingly, a description thereof is omitted.

Baffle plate 2A includes baffle plate main body 21 and four support members 22A. Baffle plate main body 21 is shared with the first embodiment; accordingly, a description thereof is omitted. Each of support members 22A is fixed on main body 11 at one end thereof such that the one end can be detached from main body 11, and supports baffle plate main body 21 at the other end thereof such that baffle plate main body 21 opposes end face 12. Support members 22A support baffle plate main body 21 such that a gap is maintained between end face 12 and baffle plate main body 21, and that a fluid path is formed that allows a fluid flowing out of concave part 13 to flow. Also, support members 22A support baffle plate main body 21 such that baffle plate main body 21 covers a part of concave part 13. Baffle plate main body 21 and support members 22A are integrally formed.

Support members 22A are formed by folding elongated plate spring materials that extend from the edge of baffle plate main body 21 at regular intervals, in a direction substantially perpendicular to baffle plate main body 21. The plate spring materials are longer than half the length in the axial direction of main body 11, and are shorter than the length in the axial direction of main body 11. The plate spring materials are folded at an angle such that main body 11 of swirl flow-forming body 1A to which baffle plate 2 is attached is pressed at the side surface thereof due to restoring forces (or elastomeric forces) of support members 22A, so that main body 11 is held between support members 22A. Each of support members 22A includes claw part 221A at an end thereof, which is to be engaged with and fixed on groove part 112 of main body 11 due to a restoring force (or an elastomeric force) of support member 22A, so that a vertical position of baffle plate 2A relative to swirl flow-forming body 1A is determined. Claw part 221A is formed by bending one end of a plate spring material into a V-shape such that, when swirl flow-forming body 1A is provided with baffle plate 2A, claw part 221A projects toward the side surface of main body 11.

Now, a suction operation of suction device 10A is described below. When swirl flow-forming body 1A is supplied with fluid from the fluid supply pump via supply port 16, the fluid passes through communication passage 18, annular passage 17, and supply paths 19 to be discharged from jetting ports 14 into concave part 13. The fluid discharged into concave part 13 creates a swirl flow within concave part 13, and subsequently flows out of the opening of concave part 13. At this time, if a strawberry is present in a position that opposes baffle plate main body 21, inflow of external fluid to concave part 13 is limited, and the density of fluid molecules per unit volume in the centre of the swirl flow becomes reduced due to centrifugal force and entrainment effect of the swirl flow; in other words, negative pressure is generated within concave part 13. As a result, fluid surrounding suction device 10A starts to flow into concave part 13 via opening 2121 and holes 2122 of baffle plate 2A, so that pressure is applied to the strawberry by the surrounding fluid to be gravitated towards suction device 10A. When the tip of the strawberry enters opening 2121 of baffle plate 2A, a position of the strawberry is determined. On the other hand, the fluid flowing out of concave part 13 passes through the flow path formed between baffle plate main body 21 and end face 12 to be discharged out of suction device 10A, without passing through opening 2121 and holes 2122 of baffle plate 2A.

Suction device 10A described in the foregoing; has a merit that spacers do not need to be formed, in addition to the merits of the first embodiment. This is because claw parts 221A of baffle plate 2A are engaged with groove parts 112 of swirl flow-forming body 1A, so that a vertical position of baffle plate 2A relative to swirl flow-forming body 1A is determined; accordingly, a gap is maintained between end face 12 and baffle plate main body 21. Also, suction device 10A has another merit that it is possible to adjust a gap between end face 12 and baffle plate main body 21 by changing grooves of main body 11 with which baffle plate 2A is engaged.

3. Modified Examples

The embodiments described above may be modified as described below. It is of note that the following modified examples may be combined.

3-1. Modified Example 1

The shape of main body 11 and concave part 13 of swirl flow-forming body 1 or 1A is not limited to being columnar, and may be a square or elliptical columnar shape. Inner-peripheral side surface 111 of main body 11 that faces concave part 12 may be tapered such that the diameter of concave part 13 enlarges toward the opening. Swirl flow-forming body 1 or 1A may be provided with a convex part that is formed within concave part 13 such that a fluid flow path is formed between the outer-peripheral side surface of the convex part and inner-peripheral side surface 111 of main body 11 (for example, refer to FIG. 13 of published unexamined patent application number 2016-159405). The number of jetting ports 14 and supply paths 19 provided in swirl flow-forming body 1 or 1A is not limited to two, and may be fewer or may be more. Jetting ports 14 may be arranged either in an upper side, at the center, or in a lower side in the axial direction of inner-peripheral side surface 111. Inclined surface 15 may not necessarily be formed. The shape of supply port 16 is not limited to being circular, and may be rectangular or elliptical. Supply port 16 may be formed on the side surface of main body 11, instead of on the top surface. Supply paths 19 may not necessarily be parallel to each other.

In suction device 10 or 10A, a radial flow-forming body that is a device for forming a radial flow that applies suction to a member by use of Bernoulli's principle may be adopted, instead of swirl flow-forming body 1 or 1A (for example, refer to FIG. 12 of published unexamined patent application number 2016-159405). The radial flow-forming body is an example of a "fluid flow-forming body" according to the present invention. The radial flow-forming body includes a columnar main body, a flat end face formed at the main body; a concave part formed at the end face, and a radial flow-forming means for forming a radial flow by discharging fluid into the concave part, the radial flow generating negative pressure that applies suction to a member.

Alternatively, in suction device 10 or 10A, a non-contact chuck using an electric fan that is a device for forming a swirl flow that applies suction to a member by use of Bernoulli's principle may be adopted, instead of swirl flow-forming body 1 or 1A (for example, refer to published unexamined patent application number 2011-138948). The non-contact chuck is an example of a "fluid flow-forming body" according to the present invention. The non-contact chuck includes a columnar main body, a flat end face formed at the main body, a concave part formed at the end face, and a swirl flow-forming means for forming a fluid swirl flow in the concave part, the fluid swirl flow generating negative pressure that applies suction to a member.

Alternatively, in suction device 10 or 10A, swirl flow-forming body described below may be adopted, instead of swirl flow-forming body 1 or 1A.

Figure 15:
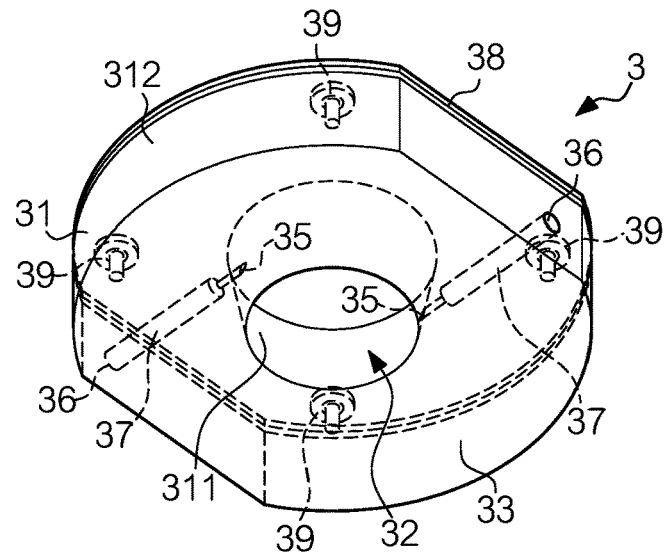
FIG. 15 is a perspective view of an example of a lower surface of swirl flow-forming body 3.
Figure 16:
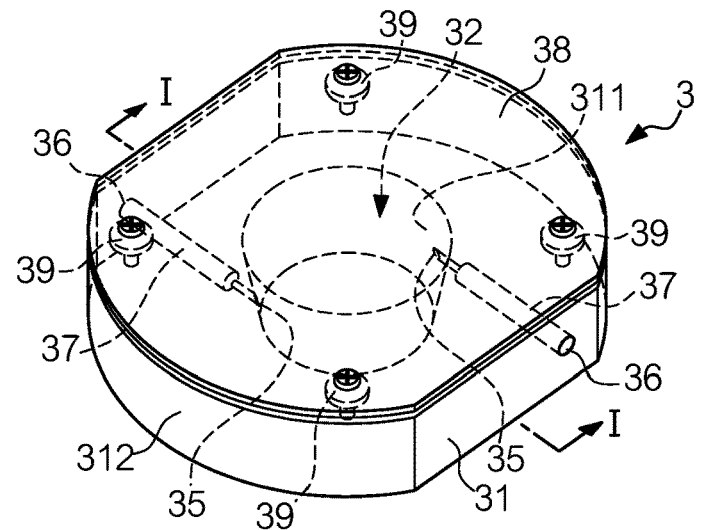
FIG. 16 is a perspective view of an example of an upper surface of swirl flow-forming body 3.
Figure 17:
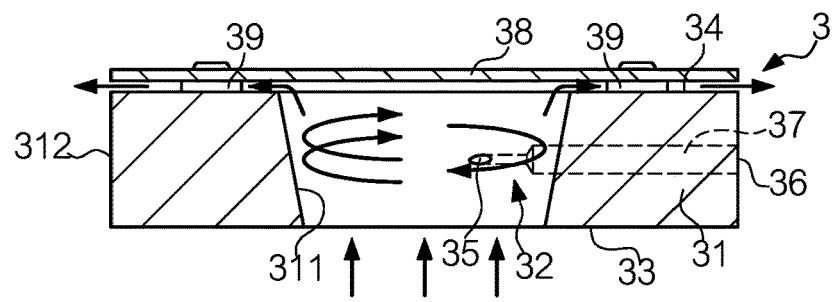
FIG. 17 is a cross-sectional view of swirl flow-forming body 3 along line I-I shown in FIG. 16.

FIG. 15 is a perspective view of an example of a lower surface of swirl flow-forming body 3. FIG. 16 is a perspective view of an example of an upper surface of swirl flow-forming body 3. FIG. 17 is a cross-sectional view of swirl flow-forming body 3 along line I-I shown in FIG. 16. Swirl flow-forming body 3 is a device for forming a swirl flow that applies suction to a member by use of Bernoulli's principle. Swirl flow-forming body 3 is an example of a "fluid flow-forming body" according to the present invention. Swirl flow-forming body 3 includes: main body 31 that is a substantially cylindrical body including through hole 32, which is an example of a "concave part" according to the present invention, that is formed at the center of the cylindrical body and has a circular cross section; flat first end face 33 that is formed on the lower surface of main body 31 such that first end face 33 opposes a member; flat second end face 34 that is formed on the upper surface of main body 31; two jetting ports 35 that are formed on inner periphery 311 of main body 31 that faces through hole 32; two supply ports 36 that are formed on outer periphery 312 of main body 31; two straight fluid passages 37 that connect jetting port 35 and supply port 36; cover 38 that has a substantially disk shape; and four spacers 39 that are members for holding cover 38 such that cover 38 opposes and is parallel to second end face 34.

The outer periphery of a cross-section of main body 31 that is substantially perpendicular to the central axis has a shape of a circle, a part of which is replaced with a straight line. Inner periphery 311 of main body 31 is tapered such that a cross-section of inner periphery 311 that is substantially perpendicular to the central axis of main body 31 gradually enlarges from the opening of first end face 33 toward the opening of second end face 34. Inner periphery 311 guides a fluid discharged from jetting port 35, in a direction away from a member, to be discharged from through hole 32. Specifically, inner periphery 311 guides the fluid toward the opening of second end face 34 to be discharged from through hole 32.

Through hole 32 is formed so as to extend straight in a direction of the central axis of main body 31. Through hole 32 opens on first end face 33 and second end face 34.

First end face 33 and second end face 34 are formed so as to be substantially perpendicular to the central axis of main body 31.

Jetting ports 35 are formed in the center of inner periphery 311 in a direction of the central axis of main body 31. Jetting ports 35 are arranged in point symmetry about the central axis of main body 31. Supply ports 36 are formed in the center of outer periphery 312 in a direction of the central axis of main body 31. Supply ports 36 are arranged in point symmetry about the central axis of main body 31. Each of supply ports 36 is connected to a fluid supply pump, which is not illustrated, via a tube, for example.

Fluid passages 37 are formed so as to extend substantially perpendicular to the central axis of main body 31, and extend in a direction tangential to the inner periphery of main body 31. Fluid passages 37 extend parallel to each other. The diameter of fluid passages 37 reduces just before jetting port 35. Fluid passages 37 discharge a fluid from jetting ports 35 into through hole 32. The fluid discharged into through hole 32 flows along the inner periphery of main body 31 due to the Coanda effect, so that a swirl flow is formed within through hole 32. Most of the fluid molecules included in the swirl flow flow out of through hole 32 and then flow along second end face 34 at an angle of approximately 45 degrees to a direction in which fluid passage 37 that has discharged the fluid molecules extends. The swirl flow formed within through hole 32 entrains a fluid remaining still in the center of through hole 32, so that negative pressure is generated in the center of through hole 32. The generated negative pressure applies suction to a member that opposes first end face 33. It is to be noted that the above angle of approximately 45 degrees is merely an example. An angle at which fluid molecules flow out of through hole 32 and then flow along second end face 34 is determined by the diameter or depth of through hole 32 and flow speed of the fluid.

Cover 38 has a shape similar to the outer periphery of a cross-section of main body 31 that is substantially perpendicular to the central axis. Cover 38 covers through hole 32 to control inflow of external fluid (specifically, gas or liquid) to through hole 32.

Spacers 39 have a columnar shape. Spacers 39 are provided along the outer edge of second end face 34 at regular intervals such that spacers 39 extend toward cover 38 in a substantially vertical direction to couple main body 31 and cover 38. Spacers 39 are fixed on main body 31 and cover 38 by use of screws, for example. Spacers 39 form, between second end face 34 and cover 38, a flow path that allows a fluid flowing out of through hole 32 to flow to be discharged out of swirl flow-forming body 3. The height of spacers 39 (that is, the gap between second end face 34 and cover 38) is determined based on the flow amount of fluid supplied from the fluid supply pump to swirl flow-forming body 3. Spacers 39 are preferably provided on second end face 34 so as not to obstruct a flow path of a fluid flowing out of through hole 32. This is to prevent turbulent flow from occurring due to collision of a fluid flowing out of through hole 32 and spacers 39. A flow path of a fluid flowing out of through hole 32 is determined by the diameter or depth of through hole 32 and flow speed of the fluid. For example, spacers 39 are preferably not provided on a line at approximately 45 degrees to a direction in which fluid passage 37 extends.

When swirl flow-forming body 3 described in the foregoing is supplied with fluid via a tube, the fluid passes through supply port 36 and fluid passage 37 to be discharged from jetting port 35 into through hole 32. The fluid discharged into through hole 32 creates a swirl flow within through hole 32. Most of the fluid molecules included in the swirl flow are guided by inner periphery 311 to flow out of through hole 32 and then flow along second end face 34. At this time, if a member is present in a position that opposes first end face 33, inflow of external fluid (specifically, gas or liquid) to through hole 32 is limited, and the density of fluid molecules per unit volume in the center of the swirl flow becomes reduced due to centrifugal force and entrainment effect of the swirl flow; namely, negative pressure is generated in the center of the swirl flow. As a result, pressure is applied to the member by surrounding fluid to be gravitated towards first end face 33.

As described in the foregoing, in swirl flow-forming body 3, most of the fluid molecules flowing out of through hole 32 flow along second end face 34 to be discharged, and a small number, if any, of fluid molecules flow along first end face 33 to be discharged, so that fluid is prevented from colliding with a plate-like member. As a result, undulation and rotation of the plate-like member is controlled as compared with a case where fluid is not discharged at the side of second end face 34; in other words, the plate-like member can be held and conveyed in a stable manner. Also, occurrence of creases, deformation, or damage in the plate-like member resulting from undulation is controlled. Swirl flow-forming body 3 makes possible use of the suction three of the swirl flow that is formed within through hole 32 in isolation.

3-2. Modified Example 2

The shape of outer annular plate 211 and inner annular plate 212 is not limited to a circular ring shape, and may be a rectangular or elliptical ring shape. The material of outer annular plate 211 is not limited to a plate spring material, and may be another type of elastic material. Alternatively, the material may be a material that is not elastically deformable. The outer diameter of outer annular plate 211 may not necessarily be identical to the outer diameter of end face 12 in length, and the inner diameter of outer annular plate 211 may not necessarily be identical to the inner diameter of end face 12 in length. In a case where the inner diameter of outer annular plate 211 is designed to be shorter than the inner diameter of end face 12, inner annular plate 212 may not be attached to outer annular plate 211, and outer annular plate 211 may include four holes that are formed around the opening of outer annular plate 211. The number of spacers 2111 included in outer annular plate 211 is not limited to four, and may be fewer or may be more. Spacers 2111 may be arranged either in an inner side, at the center, or in an outer side in the radial direction of outer annular plate 211. Spacers 2111 may not necessarily be arranged at equal intervals. The shape of spacers 2111 is not limited to being circular, and may be rectangular or elliptical. A method for forming spacers 2111 is not limited to embossing, and spacers 2111 may be formed, for example, by attaching small columnar pieces to the surface of outer annular plate 211. The number of holes 2122 included in inner annular plate 212 is not limited to four, and may be fewer or may be more. Holes 2122 may be arranged such that they oppose either concave part 13 or end face 12. Holes 2122 may not necessarily be arranged at equal intervals. The shape of holes 2122 is not limited to being circular, and may be rectangular or elliptical.

Outer annular plate 211 may be provided with guide part 2112 described below.

Figure 18:
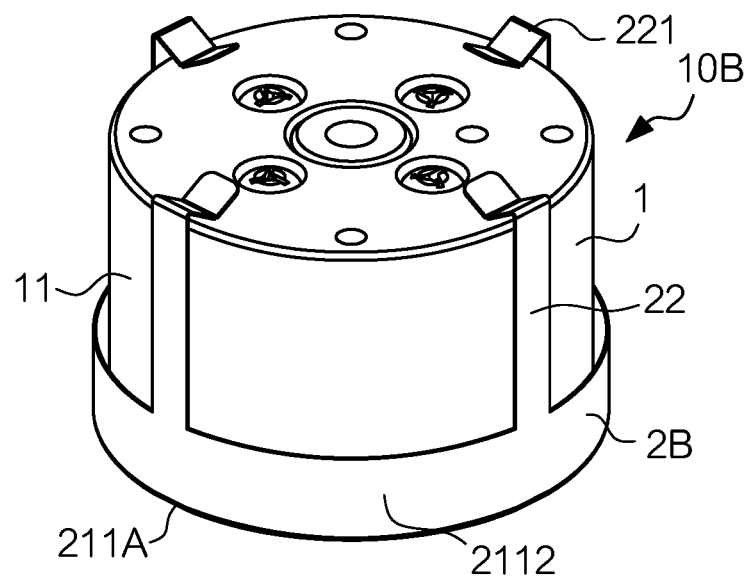
FIG. 18 is a perspective view of an example of suction device 10B.
Figure 19:
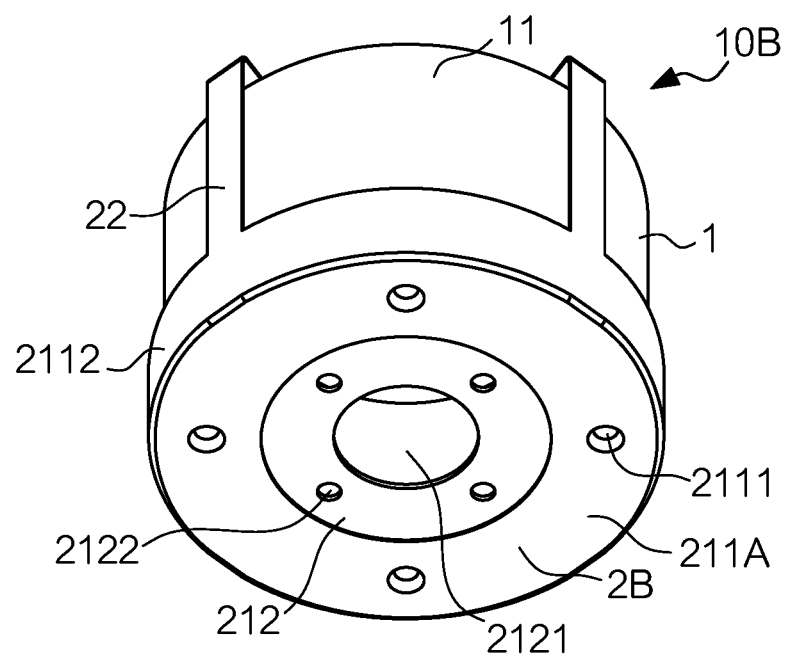
FIG. 19 is another perspective view of suction device 10B as seen from a different angle.

FIG. 18 is a perspective view of suction device 10B. FIG. 19 is another perspective view of suction device 10B as seen from a different angle. Suction device 10B differs from suction device 10 according to the first embodiment in that outer annular plate 211A includes guide part 2112. Guide part 2112 has a cylindrical shape such that, when swirl flow-forming body 1 is provided with baffle plate 2B, guide part 2112 surrounds the outer periphery of main body 11 (in other words, the opening of concave part 13), and the inner periphery of guide part 2112 is kept from coming into contact with the outer periphery of main body 11. In the example shown in the drawings, the length in the axial direction of guide part 2112 is shorter than the length in the axial direction of a half of main body 11; however, the length in the axial direction of guide part 2112 may be longer. Guide part 2112 controls flow of a fluid flowing out of concave part 13 of swirl flow-forming body 1 and then flowing along end face 12, such that the fluid flows in a direction away from a position of a member (specifically, a position occupied by the member prior to commencement of suction). Guide part 2112 controls, especially, flow of a fluid flowing out of concave part 13 and then flowing along end face 12, having a radial component, such that the fluid flows in a direction having a component of a direction in which the material is sucked. Specifically, guide part 2112 guides a fluid flowing out of concave part 13 in the upper direction of the drawings along the inner periphery of guide part 2112.

Outer annular plate 211 may be provided with a mesh or porous material, instead of inner annular plate 212 (for example, refer to FIG. 6 of published unexamined patent application number 2016-159405). Alternatively, outer annular plate 211 may be provided with a mesh part including a conical or hemispherical concave part in the center thereof (for example, refer to FIGS. 7 and 8 of published unexamined patent application number 2016-159405). The concave part determines a position of a member a part or entirety of which has entered the concave part. Alternatively, outer annular plate 211 may be provided with a regulation part that is formed by subjecting the opening end of outer annular plate 211 to radius bending such that the opening end projects toward concave part 13 (for example, refer to FIG. 9 of published unexamined patent application number 2016-159405).

3-3. Modified Example 3

Figure 20:
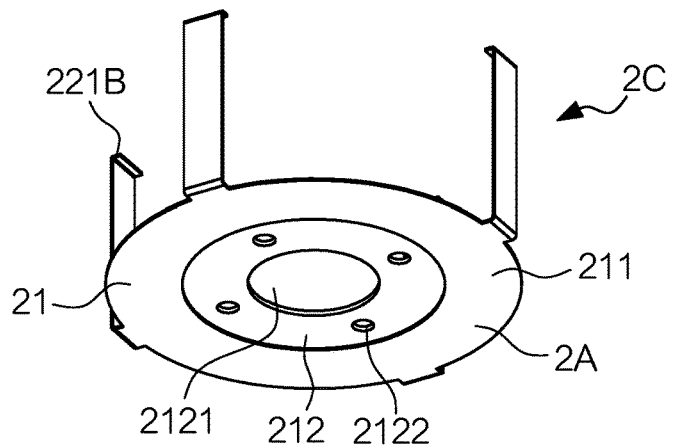
FIG. 20 is a perspective view of an example of baffle plate 2C.

The material of support members 22 or 22A is not limited to a plate spring material, and may be another type of elastic material. An angle at which plate spring materials are folded to form support members 22 or 22A may not be perpendicular to baffle plate main body 21, depending on a shape of main body 11. The number of support members 22 or 22A is not limited to four, and may be fewer or may be more. A part of each of support members 22 or 22A, which part may not necessarily be an end, may be coupled with a surface of outer annular plate 211, instead of an edge of outer annular plate 211. Support members 22 or 22A may not necessarily be arranged at equal intervals. Support members 22A may not necessarily be shorter than the length in the axial direction of main body 11. Claw parts 221 of support members 22 or claw parts 221A of support members 22A may not necessarily be formed at ends of the support members. Claw parts 221 may be hooked either on an outer edge, at the center, or at an inner side in the radial direction of the top surface of main body 11. The shape of claw parts 221 is not limited to a V-shape, and may be a flat or wave shape. Each of claw parts 221A may be formed not by bending an end of a plate spring material into a V-shape, but by folding inward one end of a plate spring material in a direction substantially perpendicular to the direction in which the plate spring material extends. FIG. 20 is a perspective view of baffle plate 2C including claw parts 221B that are formed using such a forming method. The shape of claw parts 221A may be a wave shape. Claw parts 221A may be fixed on the side surface of main body 11 by use of screws.

Baffle plate 2A according to the second embodiment may include not only four support members 22A but also one or more support members 22 according to the first embodiment. This modification makes baffle plate 2A less likely to drop from swirl flow-forming body 1A.

Suction device 10 according to the first embodiment may be provided with four support members 22B described below, instead of four support members 22.

Figure 21:
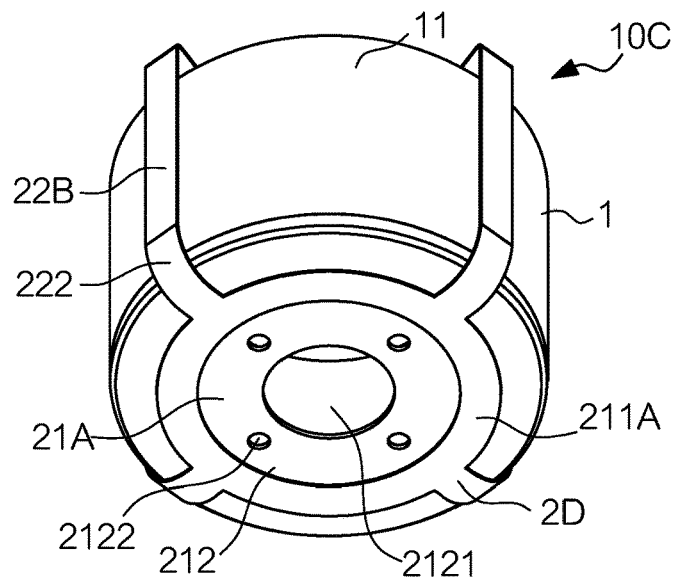
FIG. 21 is a perspective view of an example of suction device 10C.
Figure 22:
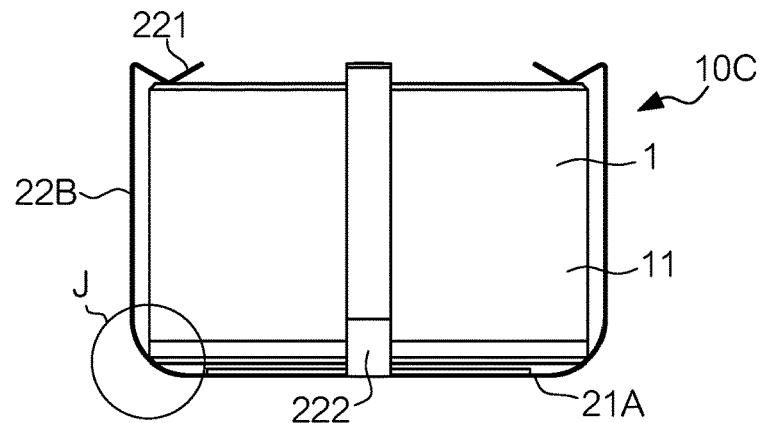
FIG. 22 is a side view of suction device 10C.
Figure 23:
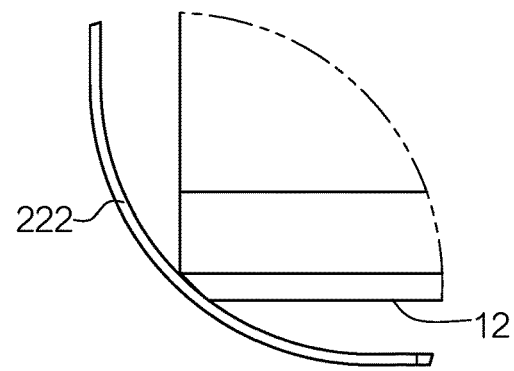
FIG. 23 is an enlarged view of part J shown in FIG. 22.

FIG. 21 is a perspective view of suction device 10C. FIG. 22 is a side view of suction device 10C. FIG. 23 is an enlarged view of part J shown in FIG. 22. Suction device 10C differs from suction device 10 in that support members 22B include R part 222, and that outer annular plate 211A lacks spacers. R part 222 is a curved section for maintaining a gap between end face 12 of swirl flow-forming body 1 and baffle plate main body 21A. R part 222 maintains the gap by supporting swirl flow-forming body 1 at the outer edge of end face 12 thereof; accordingly, suction device 10C need not include spacers. R part 222 is one example of a "gap maintaining part" according to the present invention. Support members 22B are formed by subjecting elongated plate spring materials that extend from the edge of baffle plate main body 21A at regular intervals to radius bending, such that the plate spring materials extend in a direction substantially perpendicular to baffle plate main body 21A. The plate spring materials are longer than the length in the axial direction of main body 11. When the plate spring materials are folded, the curvature is such that main body 11 of swirl flow-forming body 1 to which baffle plate 2D is attached is pressed at the side surface thereof due to restoring forces (or elastomeric forces) of support members 22B, so that main body 11 is held between support members 22B. Support members 22B include claw part 221 at an end thereof. Since the claw parts 221 are shared with the first embodiment, a description of claw parts 221 is omitted.

Figure 24:
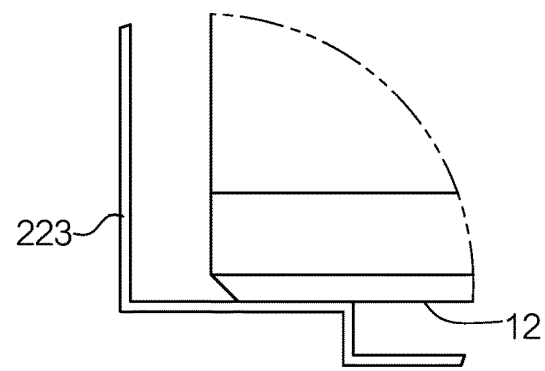
FIG. 24 is an enlarged view of an example of step part 223.

In support member 22B included in suction device 10C, R part 222 may be replaced with step part 223 shown in FIG. 24, which is a section for maintaining a gap between end face 12 of swirl flow-forming body 1 and baffle plate main body 21A. Specifically, step part 223 maintains the gap by supporting swirl flow-forming body 1 at the outer edge of end face 12 thereof. Step part 223 is one example of a "gap maintaining part" according to the present invention.

Suction device 10 according to the first embodiment may be provided with four support members 22C described below, instead of four support members 22.

Figure 25:
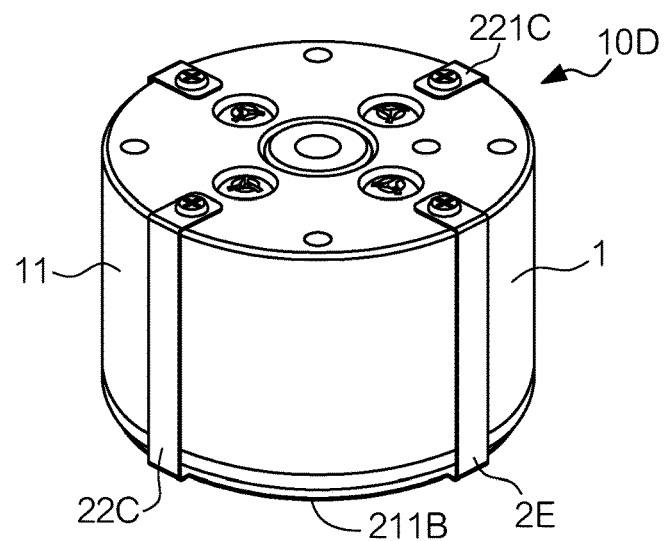
FIG. 25 is a perspective view of an example of suction device 10D.

FIG. 25 is a perspective view of suction device 10D, which differs from suction device 10 in that claw parts 221C of support members 22C are fixed on the top surface of main body 11 of swirl flow-forming body 1 by use of screws, that baffle plate 2E is attached to swirl flow-forming body 1 such that baffle plate 2E can be detached from swirl flow-forming body 1 by use of a tool, and that outer annular plate 2111 lacks spacers. Claw parts 221C differ from claw parts 221 according to the first embodiment only in that claw parts 221C are formed in a flat shape. Since claw parts 221C are fixed on the top surface of main body 11 by use of screws, a vertical position of baffle plate 2E relative to swirl flow-forming body 1A is determined. As a result, a gap between end face 12 and baffle plate main body 21 is maintained. For these reasons, suction device 10D need not include spacers.

In suction device 10D, claw parts 221C may be fixed on the top surface of main body 11 by use of a magnetic force or frictional force, instead of screws.

In suction device 10D, support members 22C and baffle plate main body 21 may either be integrally formed or separately formed. In a case where support members 22C and baffle plate main body 21 are separately formed, only baffle plate main body 21 may be detachable from swirl flow-forming body 1. For example, support members 22C may be welded onto the top surface of main body 11 of swirl flow-forming body 1, whereas baffle plate main body 21 may be fixed to support members 22C by use of screws such that baffle plate main body 21 can be detached from support members 22C by use of a tool.

Alternatively, in suction device 10D, support members 22C may be welded onto the top surface of main body 11 of swirl low-forming body 1 such that baffle plate 2E cannot be detached from swirl flow-forming body 1.

3-4. Modified Example 4

The number of groove parts 112 is not limited to four, and may be fewer or may be more. Groove parts 112 may be arranged either nearer the top surface, at the center, or nearer end face 12 in the axial direction of the side surface of main body 11. Groove parts 112 may not necessarily be arranged at equal intervals. Groove parts 112 may not necessarily be shorter in the circumferential direction than a quarter of a circle of the outer periphery of end face 12. The number of grooves included in each of groove parts 112 is not limited to three, and may be fewer or may be more. The shape of the grooves is not limited to a V-shape, and may be a U-shape.

3-5. Modified Example 5

Suction device 10 or 10A may be used to apply suction to, hold, and convey a plate-like or sheet-like member such as a semiconductor wafer or a glass substrate, instead of a food. Depending on a size of the member, plural suction devices 10 or 10A that are attached to a plate-like frame may be used (for example, refer to FIGS. 10 and 11 of published unexamined patent application number 2016-159405).

The invention claimed is:
1. A baffle plate to be attached to a fluid flow-forming body, the fluid flow-forming body comprising:

a columnar main body;

a flat end face formed at the main body;

a concave part formed at the end face; and a fluid flow-forming means for forming a fluid swirl flow in the concave part or forming a radial flow by discharging fluid into the concave part, the fluid swirl flow or the radial flow generating negative pressure that applies suction to a member, the baffle plate comprising:

a baffle plate main body that is attachable to and detachable from the fluid flow-forming body, and that allows a fluid to which suction is applied by the negative pressure to pass through, while preventing the member from entering the concave part;

a support member that is attached to the columnar main body at one end of the support member, and supports the baffle plate main body at another end of the support member such that the baffle plate main body opposes the end face, and that supports the baffle plate main body such that a gap between the end face and the baffle plate main body is maintained, and a fluid path is formed that allows a fluid flowing out of the concave part to flow; and a gap maintaining part that maintains the gap between the end face and the baffle plate main body.

2. The baffle plate according to claim 1, wherein:

the support member comprises a claw part that is hooked on a surface of the main body, the surface being opposite the end face;

the gap maintaining part and the claw part hold the main body therebetween; and the gap maintaining part forms the fluid path.

3. The baffle plate according to claim 2, wherein the baffle plate main body comprises:

an opening that is formed at a central part of the baffle plate main body, wherein insertion of a part of the member into the opening causes the member to be fixed in position; and a hole that is formed around the opening such that the baffle plate attached to the fluid flow-forming body opposes the concave part.

4. The baffle plate according to claim 3, where the support member is attached to the main body by use of an elastomeric force of the support member.

5. The baffle plate according to claim 2, where the support member is attached to the main body by use of an elastomeric force of the support member.

6. The baffle plate according to claim 1, wherein the baffle plate main body comprises:

an opening that is formed at a central part of the baffle plate main body, wherein insertion of a part of the member into the opening causes the member to be fixed in position; and a hole that is formed around the opening such that the baffle plate attached to the fluid flow-forming body opposes the concave part.

7. The baffle plate according to claim 6, where the support member is attached to the main body by use of an elastomeric force of the support member.

8. The baffle plate according to claim 1, wherein the support member is attached to the main body by use of an elastomeric force of the support member.

9. A baffle plate to be attached to a fluid flow-forming body, the fluid flow-forming body comprising:

a columnar main body;

a flat end face formed at the main body;

a concave part formed at the end face; and a fluid flow-forming means for forming a fluid swirl flow in the concave part or forming a radial flow by discharging fluid into the concave part, the fluid swirl flow or the radial flow generating negative pressure that applies suction to a member, the baffle plate comprising:

a baffle plate main body that is attachable to and detachable from the fluid flow-forming body, and that allows a fluid to which suction is applied by the negative pressure to pass through, while preventing the member from entering the concave part; and a support member that is attached to the columnar main body at one end of the support member, and supports the baffle plate main body at another end of the support member such that the baffle plate main body opposes the end face, and that supports the baffle plate main body such that a gap between the end face and the baffle plate main body is maintained, and a fluid path is formed that allows a fluid flowing out of the concave part to flow, wherein the support member is attached to the main body by use of an elastomeric force of the support member.

* * * * *